US012765027B2

(12) United States Patent
Ren et al.

(10) Patent No.: US 12,765,027 B2
(45) Date of Patent: Oct. 13, 2026

(54) LOW-TEMPERATURE SELECTIVE EPITAXY CONTACT APPROACH

(71) Applicant: Applied Materials, Inc., Santa Clara, CA (US)

(72) Inventors: He Ren, San Jose, CA (US); Raman Gaire, Mechanicville, NY (US); Shi You, San Jose, CA (US); Pranav Ramesh, Mountain View, CA (US); Houssam Lazkani, Schenectady, NY (US); Shawn Thomas, Chesterfield, MO (US); Abhishek Dube, Fremont, CA (US); Mehul B. Naik, San Jose, CA (US); Songkram Sonny Srivathanakul, Waterford, NY (US)

(73) Assignee: Applied Materials, Inc., Santa Clara, CA (US)

( * ) Notice: Subject to any disclaimer, the term of this patent is extended or adjusted under 35 U.S.C. 154(b) by 280 days.

(21) Appl. No.: 18/636,449

(22) Filed: Apr. 16, 2024

(65) Prior Publication Data

US 2024/0363354 A1 Oct. 31, 2024

Related U.S. Application Data

(60) Provisional application No. 63/462,695, filed on Apr. 28, 2023.

(51) Int. Cl.
*H10D 64/01* (2025.01)
*C30B 25/18* (2006.01)
(Continued)

(52) U.S. Cl.
CPC ......... *H10D 64/0112* (2026.01); *C30B 25/18* (2013.01); *C30B 29/06* (2013.01);
(Continued)

(58) Field of Classification Search
CPC ............. H10D 64/0112; H10D 62/151; H10D 30/031; H10D 64/01; H10W 20/01
See application file for complete search history.

(56) References Cited

U.S. PATENT DOCUMENTS 6,569,715 B1 5/2003 Forbes
8,026,539 B2 9/2011 Hargrove et al.
(Continued)

FOREIGN PATENT DOCUMENTS

TW 202002004 A 1/2020
TW 202005088 A 1/2020

OTHER PUBLICATIONS

International Search Report and Written Opinion for International Application No. PCT/US2024/024822 dated Jul. 31, 2024.
(Continued)

*Primary Examiner* — Ismail A Muse
(74) *Attorney, Agent, or Firm* — Patterson + Sheridan, LLP

(57) ABSTRACT

Semiconductor devices and methods for manufacturing the same are provided. The method includes epitaxially growing a doped crystalline silicon-containing layer over a source/drain feature and growing a doped amorphous silicon-containing layer over a field region of a semiconductor layer. The trench is formed in the semiconductor layer and the trench exposes the source/drain feature. The method further includes epitaxially growing an undoped crystalline silicon-containing capping layer over the doped crystalline silicon-containing layer and growing an undoped amorphous silicon-containing layer over the doped silicon-containing amorphous layer. The method further includes selectively removing the doped amorphous silicon-containing layer and the undoped amorphous silicon-containing layer relative to the silicon-containing crystalline capping layer. The method
(Continued)

further includes removing the silicon-containing crystalline capping layer to expose the doped silicon-containing crystalline layer.

20 Claims, 7 Drawing Sheets

(51) Int. Cl.
*C30B 29/06* (2006.01)
*C30B 29/68* (2006.01)
*H10W 20/00* (2026.01)

(52) U.S. Cl.
CPC ............. *C30B 29/68* (2013.01); *H10D 64/01* (2025.01); *H10W 20/01* (2026.01)

(56) References Cited

U.S. PATENT DOCUMENTS 8,367,528 B2 2/2013 Bauer et al.
8,809,170 B2 8/2014 Bauer
10,249,739 B2 4/2019 Guillorn et al.
10,749,032 B2 8/2020 Mohapatra et al.
11,101,359 B2 8/2021 Wu et al.
11,424,347 B2 8/2022 Liao et al.
2011/0101421 A1 5/2011 Xu
2013/0140576 A1 6/2013 Mieno et al.
2016/0336405 A1 11/2016 Sun et al.
2017/0033104 A1* 2/2017 He ....................... H10D 30/024
2017/0352762 A1* 12/2017 Yang .................. H10D 30/6211
2018/0294354 A1 10/2018 Jagannathan et al.
2019/0043993 A1 2/2019 Mohapatra et al.
2019/0221483 A1 7/2019 Mulfinger et al.
2020/0035489 A1 1/2020 Huang et al.
2020/0052120 A1 2/2020 Colinge et al.
2021/0013306 A1 1/2021 Choi et al.
2021/0305428 A1 9/2021 Ju et al.
2021/0391449 A1 12/2021 Liao et al.
2022/0051905 A1* 2/2022 Smith ..................... H10P 34/42
2022/0059703 A1 2/2022 More
2022/0115387 A1 4/2022 Yang et al.
2022/0123123 A1 4/2022 Kim et al.
2022/0181259 A1 6/2022 Chiang et al.
2022/0238650 A1 7/2022 Wu et al.
2022/0359734 A1 11/2022 Liao et al.
2022/0375788 A1 11/2022 Greene et al.
2023/0011401 A1 1/2023 Song et al.
2023/0034058 A1* 2/2023 Hung ................. H10D 64/0121
2023/0215928 A1* 7/2023 Vellianitis .............. H10D 30/62
257/288
2023/0387316 A1* 11/2023 Liang ................. H10D 30/6219

OTHER PUBLICATIONS

Taiwanese Office Action for Application No. 113115749 dated May 22, 2026.

* cited by examiner

LOW-TEMPERATURE SELECTIVE EPITAXY CONTACT APPROACH

CROSS-REFERENCE TO RELATED APPLICATIONS

This application claims the benefit of U.S. Provisional Patent Application Ser. No. 63/462,695, filed Apr. 28, 2023, which is incorporated by reference herein in its entirety.

BACKGROUND

Field

The present disclosure generally relates to the field of semiconductor devices and methods for manufacturing semiconductor devices. More particularly, the disclosure relates to low temperature selective deposition of epitaxial silicon-containing films.

Description of the Related Art

A typical selective epitaxy process involves a deposition reaction and an etch reaction. The deposition reaction causes an epitaxial layer to be formed on monocrystalline surfaces of a substrate and a polycrystalline and/or amorphous layer to be formed on non-monocrystalline surfaces, for example, a patterned dielectric layer deposited atop the substrate. The etch reaction removes the epitaxial layer and the polycrystalline and/or amorphous layer at different rates, providing a net selective process that can result in deposition of an epitaxial material and limited, or no, deposition of a polycrystalline material and/or amorphous material.

As the critical dimensions of devices continue to shrink, methods of selective epitaxial deposition involve lower processing temperatures (e.g., about 500 degrees Celsius or less). Unfortunately, typical etching gases fail to provide a suitable selective window between the epitaxial layer and the polycrystalline and/or amorphous layer at lower processing temperatures. In addition, current cyclic deposition/etch processes can be complex, difficult to maintain, and have low throughput.

For the foregoing reasons, there is a need for selective epitaxial processes that can be performed at lower temperatures.

SUMMARY

The present disclosure generally relates to the field of semiconductor devices and methods for manufacturing semiconductor devices. More particularly, the disclosure relates to low temperature selective deposition of epitaxial silicon-containing films.

In one aspect, a method of forming a semiconductor device is provided. The method includes epitaxially growing a doped crystalline silicon-containing layer over a source/drain feature and growing a doped amorphous silicon-containing layer over a field region of a semiconductor layer. The trench is formed in the semiconductor layer and the trench exposes the source/drain feature. The method further includes epitaxially growing an undoped crystalline silicon-containing capping layer over the doped crystalline silicon-containing layer and growing an undoped amorphous silicon-containing layer over the doped amorphous silicon-containing layer. The method further includes selectively removing the doped amorphous silicon-containing layer and the undoped amorphous silicon-containing layer relative to the undoped crystalline silicon-containing capping layer. The method further includes removing the undoped crystalline silicon-containing capping layer to expose the doped crystalline silicon-containing layer.

Implementations may include one or more of the following. The method further includes forming a metal silicide layer from the doped crystalline silicon-containing layer. The method further includes forming a metal-fill layer in the trench, the metal-fill layer formed over the metal silicide layer. The epitaxially growing a doped crystalline silicon-containing layer and the epitaxially growing an undoped crystalline silicon-containing capping layer are performed at a temperature below a thermal budget of the semiconductor device. The temperature is 500 degrees Celsius or less. The epitaxially growing a doped crystalline silicon-containing layer, the epitaxially growing an undoped crystalline silicon-containing capping layer, and the selectively removing a doped amorphous silicon-containing layer are performed in a processing region of a processing chamber. The selectively removing the doped amorphous silicon-containing layer is performed in a second processing region of a second processing chamber and the semiconductor device is transferred from the processing region to the second processing region without breaking vacuum. The method further includes forming backside power rails on a backside of the semiconductor device, wherein the backside power rails are electrically coupled with the metal-fill layer.

In another aspect, a method of forming a semiconductor device is provided. The method includes epitaxially growing a doped crystalline silicon-containing layer over a source/drain feature and growing a doped amorphous silicon-containing layer over a field region of a semiconductor layer. The trench is formed in the semiconductor layer and the trench exposes the source/drain feature. The epitaxially growing includes flowing a higher order silane precursor gas and an n-type dopant precursor gas into a processing region of a process chamber, the higher order silane precursor gas having a chemical formula $Si_xH_{(2x+2)}$ where x is 2 or more. The method further includes epitaxially growing an undoped crystalline silicon-containing capping layer over the doped crystalline silicon-containing layer and growing an undoped amorphous silicon-containing layer over the doped amorphous silicon-containing layer including flowing the higher order silane precursor gas into the processing region. The method further includes selectively removing the doped amorphous silicon-containing layer and the undoped amorphous silicon-containing layer relative to the undoped crystalline silicon-containing capping layer including flowing an etching gas comprising Cl2, GeCl2, GeCl4, GeH4, or a combination thereof.

Implementations may include one or more of the following. The method further includes removing the undoped crystalline silicon-containing capping layer to expose the doped crystalline silicon-containing layer. The higher order silane precursor gas is selected from trisilane, tetrasilane, or a combination thereof. The n-type dopant precursor gas is a phosphorous containing precursor gas, an antimony containing precursor gas, an arsenic containing precursor gas, or a combination thereof. The etching gas is free from hydrogen chloride (HCl) gas. The epitaxially growing a doped crystalline silicon-containing layer and the epitaxially growing an undoped crystalline silicon-containing capping layer are performed at a temperature below a thermal budget of the semiconductor device. The temperature is 500 degrees Celsius or less. The trench formed in the semiconductor layer is formed in a backside of the semiconductor device.

In yet another aspect, a method of forming a semiconductor device is provided. The method includes providing a device structure having a trench formed in a semiconductor layer. The trench exposes a source/drain feature from the backside of the device structure and the semiconductor layer is formed over a device substrate. The method further includes performing a first epitaxial deposition process to grow a doped crystalline silicon layer over the source/drain feature and grow a doped amorphous silicon layer over a field region of the semiconductor layer. The method further includes performing a second epitaxial deposition process to grow an undoped crystalline silicon capping layer over the doped crystalline silicon layer and grow an undoped amorphous silicon layer over the doped amorphous silicon layer. The method further includes performing a selective etching process to remove the undoped amorphous silicon layer and the doped amorphous silicon layer relative to the crystalline silicon capping layer.

Implementations may include one or more of the following. The first epitaxial deposition process includes introducing a deposition gas including a higher order silane precursor gas and/or a chlorosilane precursor gas and a dopant precursor gas including an n-type dopant precursor gas into the processing region of a process chamber, the higher order silane precursor gas having a chemical formula of $Si_xH_{(2x+2)}$ where x is 2 or more. The method further includes purging the processing region after the first epitaxial deposition process and prior to the second epitaxial deposition process. The second epitaxial deposition process includes introducing a deposition gas comprising the higher order silane precursor gas.

In another aspect, a non-transitory computer readable medium has stored thereon instructions, which, when executed by a processor, causes the process to perform operations of the above apparatus and/or method.

BRIEF DESCRIPTION OF THE DRAWINGS

So that the manner in which the above-recited features of the present disclosure can be understood in detail, a more particular description of the disclosure, briefly summarized above, may be had by reference to implementations, some of which are illustrated in the appended drawings. It is to be noted, however, that the appended drawings illustrate only exemplary implementations and are therefore not to be considered limiting of its scope, and may admit to other equally effective implementations.

Figure 1:
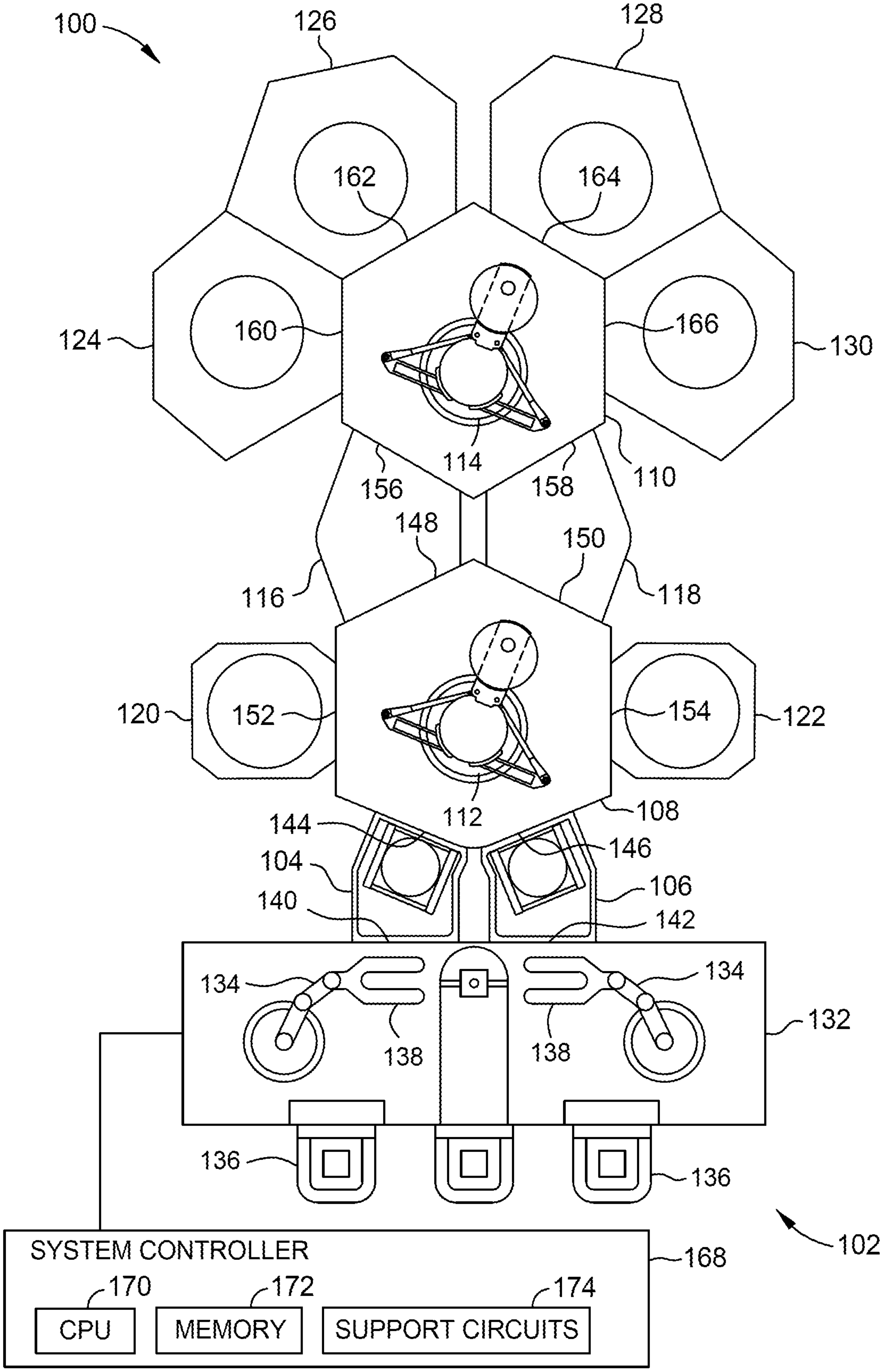
FIG. 1 illustrates a schematic top view of one example of a multi-chamber processing tool in accordance with one or more implementations of the present disclosure.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The present disclosure generally relates to the field of semiconductor devices and methods for manufacturing semiconductor devices. More particularly, the disclosure relates to low temperature selective deposition of epitaxial silicon-containing films.

Power delivery networks (PDNs) provide power to the active devices on a semiconductor device. Traditional PDNs include power rails and are designed to provide power through the semiconductor structures frontside. For example, conventional integrated circuits (ICs) are built in a stacked up orientation, having transistors at the lowest level, interconnects above the transistors to provide connectivity to the transistors, and power rails also positioned above the transistors. As ICs continue to scale down, the power rails also scale down, which can lead to increased voltage drop across the power rails as well as increased power consumption of the ICs. Backside PDNs are attempting to move power to the backside of the semiconductor device so only signals are carried by the frontside. Manufacturing backside PDNs includes, among other things, providing power rails on a backside of the semiconductor structure, the semiconductor structure already containing, for example, FinFET transistors in addition to an interconnect structure (which may include power rails as well) on a frontside of the semiconductor structure. The presence of already formed transistors and interconnects on the frontside of the semiconductor structure presents numerous manufacturing challenges, one of which is the thermal budget limitations presented by the already formed transistors and interconnects on the frontside of the semiconductor structure.

Traditional selective epitaxial deposition processes have difficulty achieving selective epitaxial deposition at low temperatures (e.g., 450 degrees Celsius or less) necessitated by these thermal budget limitations for logic backside contact. The deposition precursors used in traditional selective epitaxial deposition processes typically involve high temperature, for example, greater than 550 degrees Celsius for sufficient growth rate. Further, hydrogen chloride (HCl), which is the etching gas used in traditional selective epitaxial deposition does not actively etch at low temperatures. In addition, it is more challenging to achieve high active dopant concentration in epitaxial films deposited at low temperatures.

Implementations of the present disclosure provide methods, systems, and structures for achieving selective epitaxial deposition at low temperatures, for example, temperatures of 500 degrees Celsius or less or 450 degrees Celsius or less. Implementations of the present disclosure are suitable for logic backside contact and other applications that involve low-temperature, selective, and high active-dopant epitaxial deposition and thus enable the formation of backside PDNs. In one or more implementations, which can be combined with other implementations a method of low temperature epitaxial deposition is provided. The method is performed at a temperature of 450 degrees Celsius or less. The method includes the use of a higher order silane precursor and/or a higher order chlorosilane precursor, and an n-type dopant precursor selected from an antimony-containing precursor, a phosphorous-containing precursor, an arsenic-containing precursor, or a combination thereof.

FIG. 1 illustrates a schematic top view of a multi-chamber processing system 100 in accordance with one or more implementations of the present disclosure. The processing system 100 can be used for low temperature selective epitaxial deposition of silicon-containing epitaxial films without breaking vacuum in accordance with one or more implementations of the present disclosure. The processing system 100 generally includes a factory interface 102, load lock chambers 104, 106, transfer chambers 108, 110 with respective transfer robots 112, 114, holding chambers 116, 118, and processing chambers 120, 122, 124, 126, 128, 130. As detailed herein, substrates in the processing system 100 can be processed in and transferred between the various chambers without exposing the substrates to an ambient environment exterior to the processing system 100, for example, an atmospheric ambient environment such as may be present in a fab. The substrates can be processed in and transferred between the various chambers maintained at a low pressure, for example, less than or equal to about 300 Torr, or a vacuum environment without breaking the low pressure or vacuum environment among various processes performed on the substrates in the processing system 100. Accordingly, the processing system 100 may provide for an integrated solution for processing of substrates.

Examples of processing systems that may be suitably modified in accordance with the teachings provided herein include the Endura®, Producer® or Centura® integrated processing systems or other suitable processing systems commercially available from Applied Materials, Inc., located in Santa Clara, California. It is contemplated that other processing systems (including those from other manufacturers) may be adapted to benefit from aspects described herein.

In the illustrated example of FIG. 1, the factory interface 102 includes a docking station 132 and factory interface robots 134 to facilitate transfer of substrates. The docking station 132 is adapted to accept one or more front opening unified pods (FOUPs) 136. In some examples, each factory interface robot 134 generally includes a blade 138 disposed on one end of the respective factory interface robot 134 adapted to transfer the substrates from the factory interface 102 to the load lock chambers 104, 106.

The load lock chambers 104, 106 have respective ports 140, 142 coupled to the factory interface 102 and respective ports 144, 146 coupled to the transfer chamber 108. The transfer chamber 108 further has respective ports 148, 150 coupled to the holding chambers 116, 118 and respective ports 152, 154 coupled to processing chambers 120, 122. Similarly, the transfer chamber 110 has respective ports 156, 158 coupled to the holding chambers 116, 118 and respective ports 160, 162, 164, 166 coupled to processing chambers 124, 126, 128, 130. The ports 144, 146, 148, 150, 152, 154, 156, 158, 160, 162, 164, 166 can be, for example, slit valve openings with slit valves for passing substrates therethrough by the transfer robots 112, 114 and for providing a seal between respective chambers to prevent a gas from passing between the respective chambers. Generally, any port is open for transferring a substrate therethrough. Otherwise, the port is closed.

The load lock chambers 104, 106, the transfer chambers 108, 110, the holding chambers 116, 118, and the processing chambers 120, 122, 124, 126, 128, 130 may be fluidly coupled to a gas and pressure control system (not specifically illustrated). The gas and pressure control system can include one or more gas pumps (for example, turbo pumps, cryo-pumps, roughing pumps) gas sources, various valves, and conduits fluidly coupled to the various chambers. In operation, the factory interface robot 134 transfers a substrate from the FOUP 136 through the port 140 or 142 to the load lock chamber 104 or 106. The gas and pressure control system then pumps down the load lock chamber 104 or 106. The gas and pressure control system further maintains the transfer chambers 108, 110 and the holding chambers 116, 118 with an interior low pressure or vacuum environment (which may include an inert gas). Hence, the pumping down of the load lock chamber 104 or 106 facilitates passing the substrate between, for example, the atmospheric environment of the factory interface 102 and the low pressure or vacuum environment of the transfer chamber 108.

With the substrate in the load lock chamber 104 or 106 that has been pumped down, the transfer robot 112 transfers the substrate from the load lock chamber 104 or 106 into the transfer chamber 108 through the port 144 or 146. The transfer robot 112 is then capable of transferring the substrate to and/or between any of the processing chambers 120, 122 through the respective ports 152, 154 for processing and the holding chambers 116, 118 through the respective ports 148, 150 for holding to await further transfer. Similarly, the transfer robot 114 is capable of accessing the substrate in the holding chamber 116 or 118 through the port 156 or 158 and is capable of transferring the substrate to and/or between any of the processing chambers 124, 126, 128, 130 through the respective ports 160, 162, 164, 166 for processing and the holding chambers 116, 118 through the respective ports 156, 158 for holding to await further transfer. The transfer and holding of the substrate within and among the various chambers can be in the low pressure or vacuum environment provided by the gas and pressure control system.

The processing chambers 120, 122, 124, 126, 128, 130 can be any appropriate chamber for processing a substrate. In some examples, the processing chamber 120 can be capable of performing an etch process, the processing chamber 122 can be capable of performing a cleaning process, and the processing chambers 124, 126, 128, 130 can be capable of performing respective growth processes. The processing chamber 116 may be a Preclean XT chamber available from Applied Materials, Inc. The processing chamber 120 may be a SiCoNi™ Pre-clean chamber or its alternatives available from Applied Materials of Santa Clara, Calif. The processing chamber 122 may be a Selectra™ Etch chamber available from Applied Materials of Santa Clara, Calif. The processing chamber 124, 126, 128, or 130 may be a Centura™ Epi chamber, Volta™ CVD/ALD chamber, or combinations thereof, all of which are available from Applied Materials of Santa Clara, Calif.

A system controller 168 is coupled to the processing system 100 for controlling the processing system 100 or components thereof. For example, the system controller 168 may control the operation of the processing system 100 using a direct control of the chambers 104, 106, 108, 110, 116, 118, 120, 122, 124, 126, 128, 130 of the processing system 100 or by controlling controllers associated with the chambers 104, 106, 108, 110, 116, 118, 120, 122, 124, 126, 128, 130. In operation, the system controller 168 enables data collection and feedback from the respective chambers to coordinate performance of the processing system 100.

The system controller 168 generally includes a central processing unit (CPU) 170, memory 172, and support circuits 174. The CPU 170 may be one of any form of a general-purpose processor that can be used in an industrial setting. The memory 172, non-transitory computer-readable medium, or machine-readable storage device, is accessible by the CPU 170 and may be one or more of memory such as random access memory (RAM), read only memory (ROM), floppy disk, hard disk, or any other form of digital storage, local or remote. The support circuits 174 are coupled to the CPU 170 and may comprise cache, clock circuits, input/output subsystems, power supplies, and the like. The various methods disclosed herein may generally be implemented under the control of the CPU 170 by the CPU 170 executing computer instruction code stored in the memory 172 (or in memory of a particular processing chamber) as, for example, a software routine. That is, the computer program product is tangibly embodied on the memory 172 (or non-transitory computer-readable medium or machine-readable storage device). When the computer instruction code is executed by the CPU 170, the CPU 170 controls the chambers to perform processes in accordance with the various methods.

The instructions in memory 172 may be in the form of a program product, such as a program that implements the methods of the present disclosure. In one example, the disclosure may be implemented as a program product stored on a computer-readable storage media for use with a computer system. The program(s) of the program product define functions of the implementations (including the methods described herein). Thus, the computer-readable storage media, when carrying computer-readable instructions that direct the functions of the methods described herein, are implementations of the present disclosure. The system controller 168 is configured to perform methods such as portions of the method 200 stored in the memory 172.

In particular implementations, at least one of the processing chambers 120 and 116 is a pre-clean chamber configured to perform the pretreatment processes of operation 220, at least one of the processing chambers 124, 126, 128, 130 is an EPI chamber configured to perform the epitaxial deposition processes of at least one of operations 230 and 240 and the selective removal process of operation 250 of the method 200, and another of the processing chambers 124, 126, 128, 130 is an etching chamber configured to perform the undoped silicon de-cap etch of operation 260 of the method 200 without breaking vacuum between any of the operations 210-260.

In operation, a substrate having a feature formed therein may be transferred to a first processing chamber which is one of the processing chambers 116 and 120 where the feature is exposed to a pretreatment process to remove, for example, native oxides formed on the feature. The substrate may then be transferred to a second processing chamber which is one of the processing chamber 124, 126, 128, and 130 without breaking vacuum where a doped crystalline layer, for example, a doped crystalline silicon-containing layer is deposited over the feature. The substrate may then be transferred to a third processing chamber which is one of the processing chambers 124, 126, 128, and 130 without breaking vacuum, where an undoped silicon-containing crystalline capping layer is grown on the doped crystalline layer.

Other processing systems can be in other configurations. For example, more or fewer processing chambers may be coupled to a transfer apparatus. In the illustrated example, the transfer apparatus includes the transfer chambers 108, 110 and the holding chambers 116, 118. In other examples, more or fewer transfer chambers (for example, one transfer chamber) and/or more or fewer holding chambers (for example, no holding chambers) may be implemented as a transfer apparatus in a processing system.

Figure 2A:
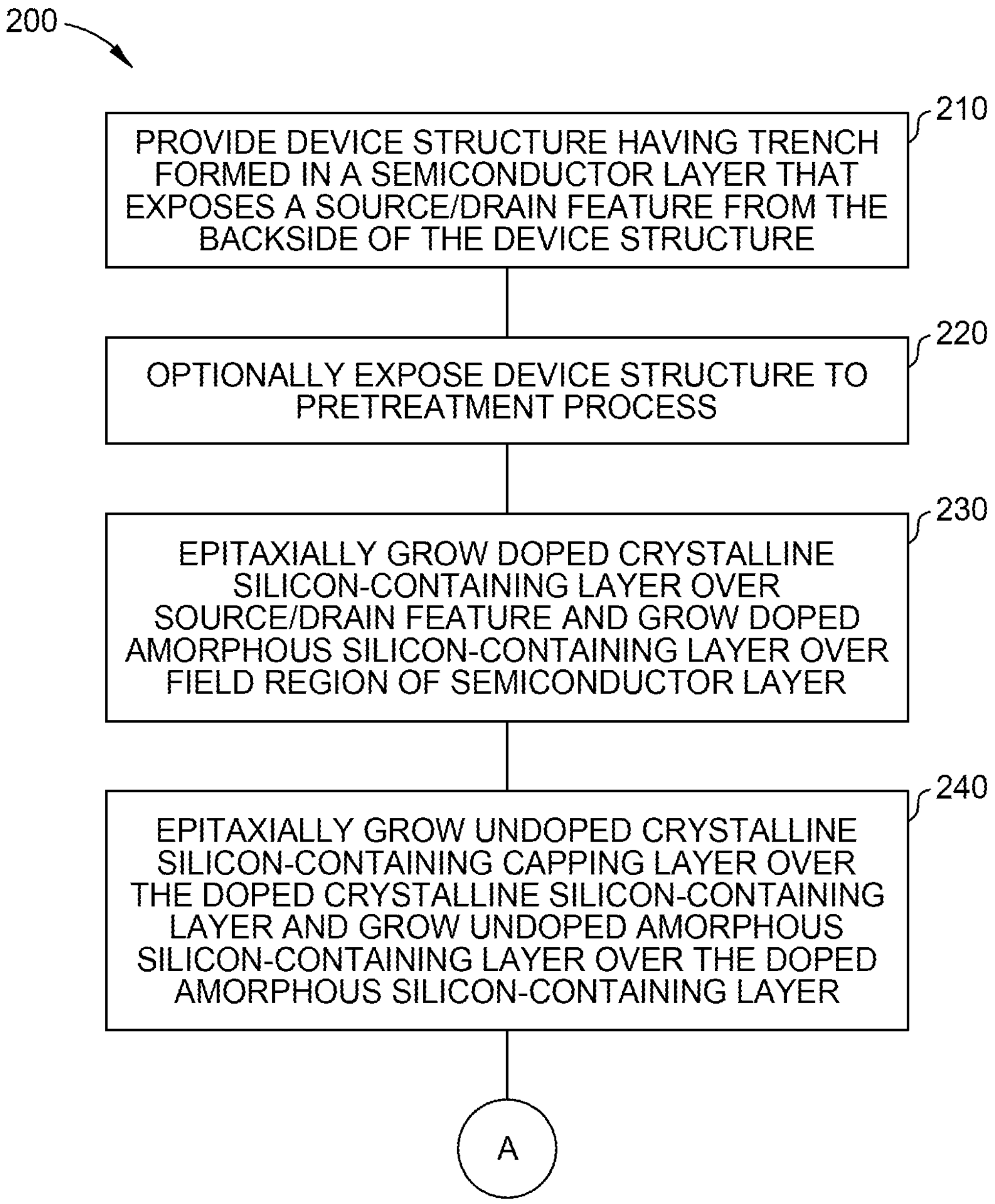
FIGS. 2A-2B illustrate flow charts of a method for manufacturing a semiconductor device in accordance with one or more implementations of the present disclosure.
Figure 2B:
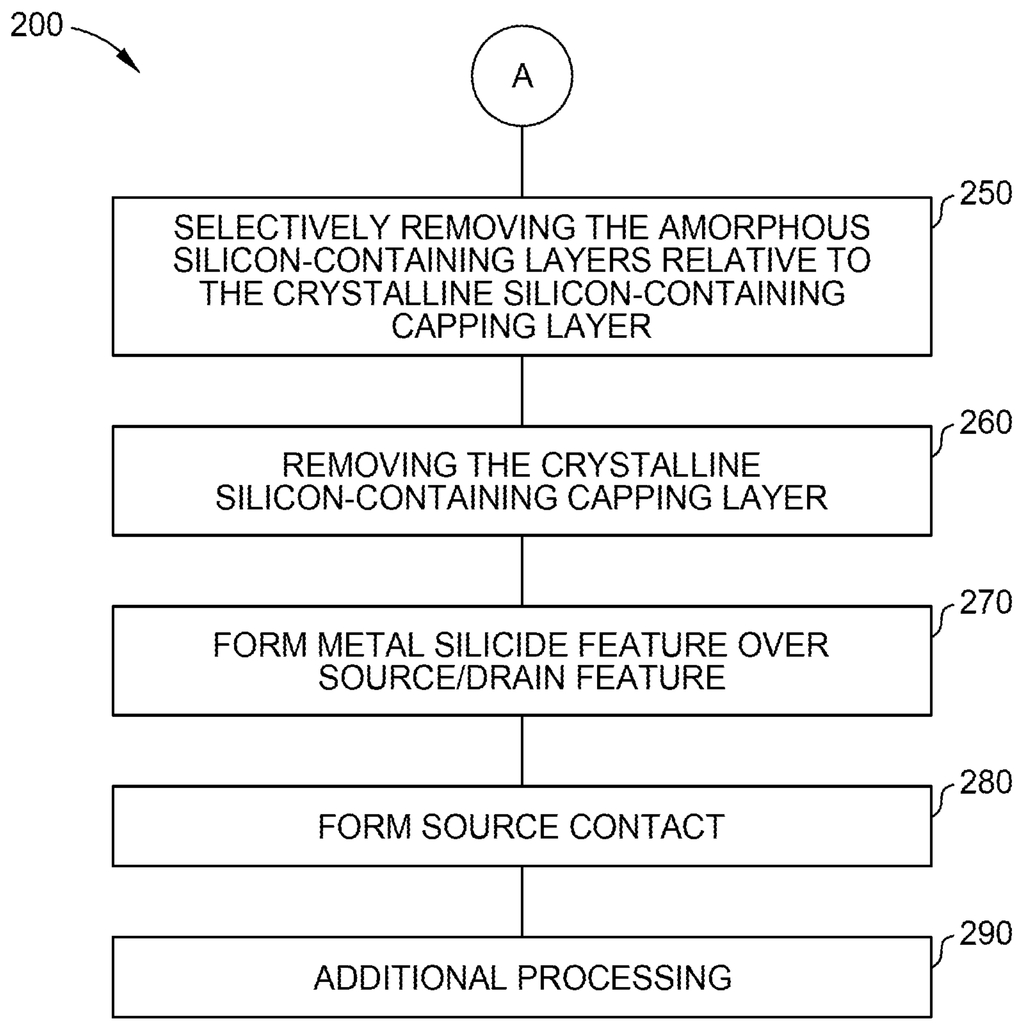

FIGS. 2A-B illustrate flow charts of a method 200 for manufacturing a semiconductor device in accordance with one or more implementations of the present disclosure. FIGS. 3A-H illustrate views of various stages of manufacturing a semiconductor device in accordance with one or more implementations of the present disclosure. Although FIGS. 3A-H are described in relation to the method 200, it will be appreciated that the structures disclosed in FIGS. 3A-H are not limited to the method 200, but instead may stand alone as structures independent of the method 200. Similarly, although the method 200 is described in relation to FIGS. 3A-H, it will be appreciated that the method 200 is not limited to the structures disclosed in FIGS. 3A-H but instead may stand alone independent of the structures disclosed in FIGS. 3A-H. It should be understood that FIGS. 3A-H illustrate only partial schematic views of the semiconductor device 300, and the semiconductor device 300 may contain any number of transistor sections and additional materials having aspects not illustrated in the figures. It should also be noted that although the method 200 illustrated in FIG. 2A-B is described sequentially, other process sequences that include one or more operations that have been omitted and/or added, and/or has been rearranged in another desirable order, fall within the scope of the implementations of the disclosure provided herein.

Figure 3A:
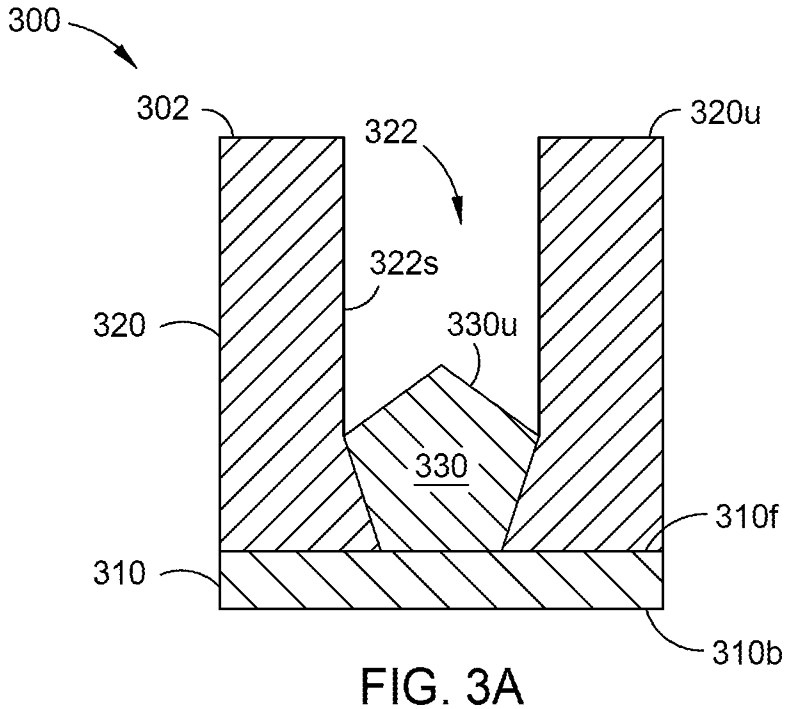
FIGS. 3A-3H illustrate views of various stages of manufacturing a semiconductor device in accordance with one or more implementations of the present disclosure.

Referring to FIG. 2A, at operation 210, a semiconductor device (or a semiconductor structure) 300 having a feature formed therein is provided. FIG. 3A illustrates a cross-sectional view of the semiconductor device 300 during intermediate stages of manufacturing corresponding to the operation 210. In some implementations, the semiconductor device 300 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof. FIGS. 3A-H have been simplified for the sake of clarity to better understand the implementations of the present disclosure. Additional features can be added in the semiconductor device 300, and some of the features described below can be replaced, modified, or eliminated in other implementations of the semiconductor device 300.

The semiconductor device 300 includes a device substrate 310 having one or more layers formed thereon, for example, a semiconductor layer 320 as is shown in FIG. 3A. The semiconductor layer has a trench 322 formed therein. The trench 322 exposes a source/drain feature 330 from a backside 302 of the semiconductor device 300. The device substrate 310 may be or include a bulk semiconductor substrate, a semiconductor-on-insulator (SOI) substrate, or the like, which may be doped (e.g., with a p-type dopant or an n-type dopant) or undoped. In some implementations, the semiconductor material of the device substrate 310 may include an elemental semiconductor, for example, such as silicon (Si) or germanium (Ge); a compound semiconductor including, for example, silicon carbide, gallium arsenide, gallium phosphide, indium phosphide, indium arsenide, and/or indium antimonide; an alloy semiconductor including, for example, SiGe, GaAsP, AlInAs, GaInAs, GaInP, and/or GaInAsP; a combination thereof, or the like. The device substrate 310 may include additional materials, for example, silicide layers, metal silicide layers, metal layers, dielectric layers, etch stop layers, interlayer dielectrics, or a combination thereof.

The device substrate 310 may further include integrated circuit devices (not shown). For example, the device substrate 310 may further include FinFET transistors in addition to interconnect structures. As one of ordinary skill in the art will recognize, a wide variety of integrated circuit devices such as transistors, diodes, capacitors, resistors, the like, or combinations thereof may be formed in and/or on the device substrate 310 to generate the structural and functional requirements of the design for the resulting semiconductor device 300.

The device substrate 310 has a frontside **310*f* (also referred to as a front surface) and a backside 310*b* (also referred to as a back surface) opposite the frontside 310*f*. It should be noted that the terms "frontside" and "backside" of the device substrate 310 refer to the orientation of the device substrate 310 as illustrated. The semiconductor layer 320 is formed over the frontside 310*f* of the device substrate 310. The semiconductor layer 320 may include multiple layers. The semiconductor layer 320 includes an upper surface 320*u* or field region. In some implementations, the semiconductor layer 320 includes or is a dielectric material, such as a low k dielectric (SiCOH), silicon oxide, silicon dioxide (SiO2), silicon nitride (SixNy), silicon nitride (Si3N4), silicon carbide (SiC), silicon oxynitride (SiON), aluminum oxide (Al2O3), aluminum nitride (AlN), a combination thereof, or multi-layers thereof. In one example, the semiconductor layer 320 is or includes silicon oxide. In another example, the semiconductor layer 320 is or includes silicon nitride. In some implementations, the semiconductor layer 320** consists essentially of silicon oxide. It is noted that the foregoing descriptors, for example, silicon oxide, should not be interpreted to disclose any particular stoichiometric ratio. Accordingly, "silicon oxide" and the like will be understood by one skilled in the art as a material consisting essentially of silicon and oxygen without disclosing any specific stoichiometric ratio.

The semiconductor layer 320 is patterned to form the trench 322. The trench exposes the source/drain feature 330. The trench 322 may be a high aspect ratio (HAR) feature. In some implementations, the trench 322 extends from the upper surface **320*u* of the semiconductor layer 320 toward the frontside 310*f* of the device substrate 310. The trench 322 includes sidewall surface(s) 322*s*. In some implementations, the sidewall surface(s) 322*s* is tapered. The sidewall surface(s) 322*s* may be defined by the semiconductor layer 320 and the bottom of the trench 322 may be defined by the source/drain feature 330. The source/drain feature 330 may be formed from epitaxially grown semiconductor material. The semiconductor material may be or include silicon, silicon germanium, silicon carbide, silicon phosphorous, silicon carbon phosphorous, pure or substantially pure germanium, a III-V compound semiconductor, a II-VI compound semiconductor, or the like. The semiconductor material may be doped, for example, doped with an n-type dopant. The epitaxial source/drain feature 330 may be doped by in-situ doping during epitaxial growth or by implanting dopants into the epitaxial source/drain feature 330 after epitaxial growth. In some implementations, the source/drain feature 330 may be formed from phosphorous-doped silicon or p-doped silicon (Si:P). The source/drain feature 330 has an upper surface 330*u* that is exposed by the trench 322**.

In some implementations, the semiconductor device 300 has native oxides or other contaminants formed on exposed surfaces, for example, the upper surface **320*u*, the sidewall surface(s) 322*s* of the trench 322 and/or the upper surface 330*u* of the source/drain feature 330. The semiconductor device 300 may be exposed to atmosphere prior to or during processing, which may lead to the formation of native oxides on the exposed surfaces. For example, if a vacuum break occurs prior to or during the method 200, the vacuum break can lead to the formation of native oxides on exposed silicon surfaces. In addition, other processes performed prior to or during the method 200** may lead to the formation of additional contaminants or debris on the exposed surfaces.

Figure 3B:
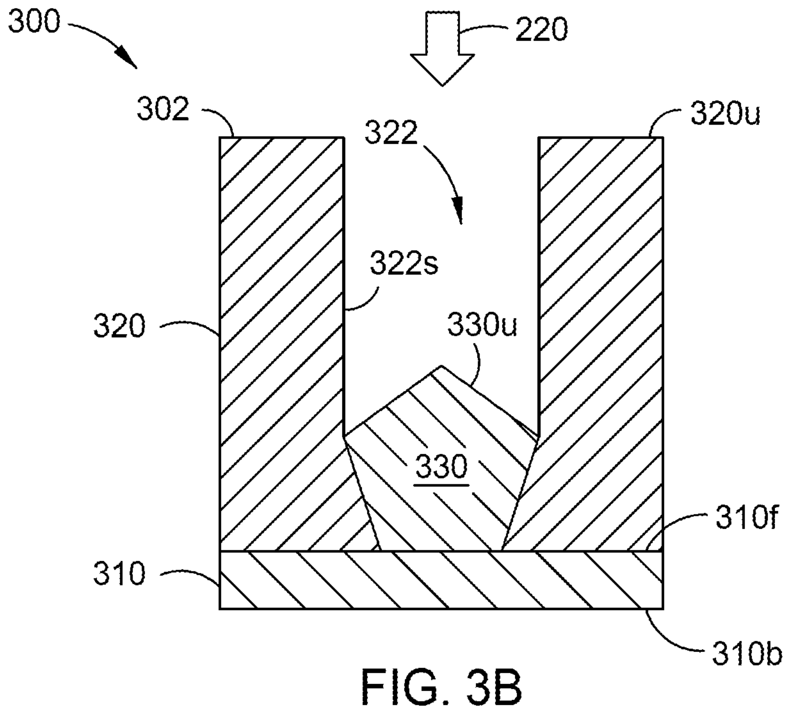

Referring to FIG. 2A, optionally, at operation 220, the semiconductor device 300 is exposed to a pretreatment process. FIG. 3B illustrates a cross-sectional view of a semiconductor device 300 during intermediate stages of manufacturing corresponding to operation 220. The pretreatment process of operation 220 can include one or more native oxide removal processes for removing native oxides (if present). The pretreatment process of operation 220 can include one or more dry clean processes. Any suitable dry clean process may be performed. The dry clean process may include a plasma etch process, such as a two-part dry chemical clean process using $NF_3$ and $NH_3$, an H2 and O2 plasma etch process, an H2 plasma etch process, an NF3/H2 plasma etch, a remote plasma etch including one or more of H2, H2O, NH3, and argon, or a combination thereof.

In one or more implementations, which can be combined with other implementations, the semiconductor device 300 is exposed to a dry clean process and/or a degas process prior to operation 230. The dry clean process may be used to remove oxides from the exposed surfaces of the semiconductor device 300. For example, if the semiconductor device 300 includes silicon, the Applied Materials SICONI® clean processes may be performed for removing oxides from the exposed surfaces of the semiconductor layer 320 and the source/drain feature 330. The SICONI® clean process removes native oxides through a low-temperature, two-part dry chemical clean process using $NF_3$ and $NH_3$. The clean process may be performed in a processing chamber positioned on a cluster tool, for example, the chamber 116 and/or the processing chamber 120 of the processing system 100 (see FIG. 1). Exemplary pre-clean chambers in which the dry clean process of operation 220 may be performed include the SICONI® clean chamber and the Preclean XT chamber available from Applied Materials, Inc., of Santa Clara, Calif.

In one or more implementations which can be combined with other implementations, the pre-treatment process is a plasma treatment process. The plasma treatment process can be an inductively coupled plasma (ICP) process or a capacitively coupled plasma (CCP) process. The plasma can be formed ex-situ in a remote plasma source (RPS). The plasma can be a direct plasma formed in-situ, for example, generated within a processing region. In one or more implementations, which can be combined with other implementations, the plasma treatment process includes exposing the semiconductor device 300 to a plasma formed from a process gas including a hydrogen-containing gas. In one or more implementations, which can be combined with other implementations, the plasma treatment process includes exposing the semiconductor device 300 to a plasma formed from a process gas including both a hydrogen-containing gas and an oxygen-containing gas. In one example, the plasma treatment process includes exposing the trench 322 to an ICP formed from a process gas including a hydrogen-containing gas and an oxygen-containing gas. The process gas may further include an inert gas, for example, argon (Ar), helium (He), krypton (Kr), or a combination thereof. In one or more implementations, which can be combined with other implementations, the plasma treatment process includes exposing the feature to a plasma formed from a process gas including one or more of $H_2$, $O_2$, Ar, or a combination thereof. In one or more implementations, which can be combined with other implementations, the plasma treatment process includes exposing the feature to a plasma formed from a process gas including one or more of NF3, H2, or a combination thereof. In one or more implementations, which can be combined with other implementations, the plasma treatment process includes exposing the feature to a plasma formed from a process gas including one or more of H2, H2O, NH3, Ar, or a combination thereof. In one or more implementations, which can be combined with other implementations, the plasma treatment process can include exposing the feature to a hydrogen and oxygen plasma treatment. The hydrogen and oxygen plasma treatment can include a saturation conformal treatment, which includes a longer soak time and/or high reactant treatment, to provide for good subsequent metal-fill of the feature.

Figure 3C:
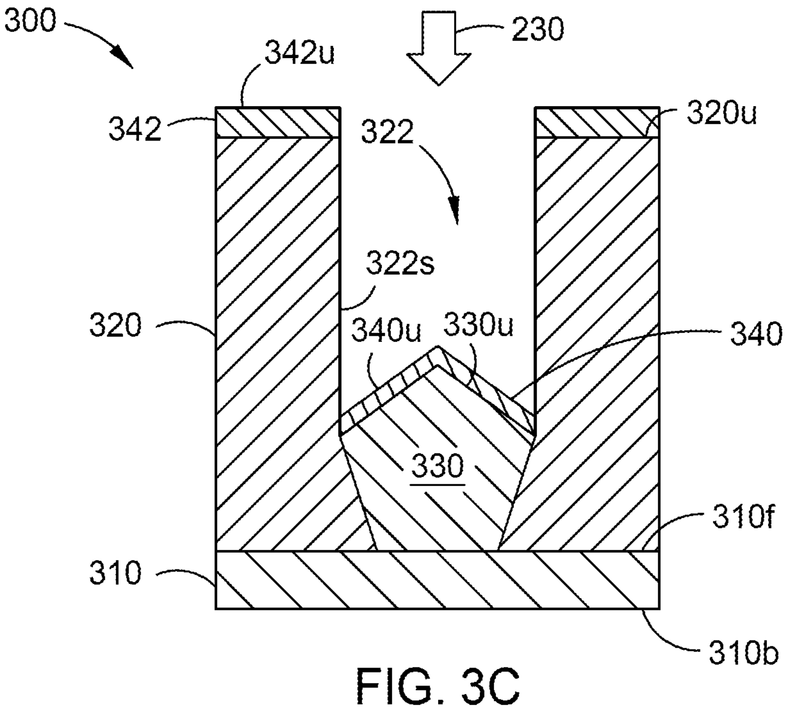

Referring to FIG. 2A, at operation 230, a doped crystalline silicon-containing layer 340 is epitaxially grown over the source/drain feature 330 and a doped amorphous silicon-containing layer 342 is formed over the upper surface 320*u* of the semiconductor layer 320. FIG. 3C illustrates a cross-sectional view of the semiconductor device 300 during intermediate stages of manufacturing corresponding to the operation 230. The doped crystalline silicon-containing layer 340 and the doped amorphous silicon-containing layer 342 may be doped with an n-type dopant. In some implementations, the n-type dopant is phosphorous. The doped crystalline silicon-containing layer 340 and the doped amorphous silicon-containing layer 342 are formed on underlying materials during the same deposition process. For example, the doped crystalline silicon-containing layer 340 is epitaxially grown on the upper surface 330*u* of the source/drain feature 330 while the doped amorphous silicon-containing layer 342 forms on the upper surface 320*u* of the semiconductor layer 320.

In some implementations, the doped crystalline silicon-containing layer 340 is doped with n-type dopants with an active dopant concentration of greater than 1.4E20 at/cm−3, for example, in a range from about 2E20 to about 1E22, or in a range from about 5E20 to about 5E21, depending upon the targeted conductive characteristics of the doped crystalline silicon-containing layer 340.

It is noted that doped amorphous silicon-containing layer 342 formed on the upper surface 320*u* is unwanted deposition. During conventional epitaxial deposition, which is performed at higher temperatures, an etchant such as HCl would be used to simultaneously remove the doped amorphous silicon-containing layer 342 while the doped crystalline silicon-containing layer 340 is grown. However, due to thermal budget limitations that may be present when the method 200 is performed, the low-temperature epitaxial deposition process described is performed at temperatures where the etch rate of HCl is very low. Thus, unwanted deposition of the doped amorphous silicon-containing layer 342 occurs on the upper surface 320*u*.

The epitaxial growth process of operation 230 is typically performed at lower temperatures, for example, a temperature of 500 degrees Celsius or less, 480 degrees Celsius or less, 450 degrees Celsius or less, or 400 degrees Celsius or less. The epitaxial growth process of operation 230 further includes flowing a higher order silane and/or higher order chlorosilane, and an n-type dopant into the processing region of a process chamber to form the doped amorphous silicon-containing layer 342 while the doped crystalline silicon-containing layer 340 is epitaxially grown on the upper surface 330*u* of the source/drain feature 330. During the epitaxial growth process of operation 230, positioning the substrate in a processing region of a processing chamber may include adjusting one or more reactor conditions, such as temperature, pressure, and/or carrier gas (e.g., Ar, $N_2$, H2, or He) flow rate, to conditions suitable for epitaxial film formation. The epitaxial deposition process of operation 230 may be performed in a processing chamber positioned on a cluster tool, for example, any of the processing chambers 124, 126, 128, 130 of the processing system 100 (see FIG. 1).

During the epitaxial growth process of operation 230, the semiconductor device 300 is heated to a temperature below the thermal budget of the semiconductor device 300, for example, a temperature of 500 degrees Celsius or less or a temperature of 480 degrees Celsius or less. In at least one aspect, the temperature in the processing chamber may be adjusted so that a reaction region formed at or near an exposed surface of the semiconductor device 300, or that the surface of the semiconductor device 300, is about 480 degrees Celsius or less, or about 450 degrees Celsius or less, or about 400 degrees Celsius or less, or about 350 degrees Celsius or less. In one example, the substrate is heated to a temperature in a range from about 350 degrees Celsius to about 500 degrees Celsius, or in a range from about 350 degrees Celsius to about 480 degrees Celsius, or in a range from about 350 degrees Celsius to about 400 degrees Celsius, or in a range from about 400 degrees Celsius to about 480 degrees Celsius. Not to be bound by theory but in some implementations where Si:P is formed, deposition of Si:P at temperatures below 350 degrees Celsius has a very slow growth rate and deposition at temperatures greater than 480 degrees Celsius may affect the thermal budget of other materials formed on the semiconductor device 300. It is possible to minimize the thermal budget of the final device by heating the substrate to the lowest temperature sufficient to thermally decompose process reagents and epitaxially deposit a layer on the substrate. The pressure in the processing chamber may be adjusted so that the reaction region pressure is within range of about 1 to about 760 Torr, or in a range from about 1 torr to about 600 torr, or in a range from about 10 torr to about 300 torr, or in a range from about 10 torr to about 100 torr. In some implementations, a carrier gas (e.g., nitrogen) may be flowed into the processing chamber at a flow rate of approximately 1 to 40 SLM (standard liters per minute). Nitrogen remains inert during low temperature deposition processes. Therefore, nitrogen is not incorporated into the deposited layers during the low temperature epitaxial growth process of operation 230. Also, a nitrogen carrier gas does not form hydrogen-terminated surfaces as does a hydrogen carrier gas. However, it will be appreciated that in some implementations, a different carrier/diluent gas may be employed, for example, an inert carrier gas such as argon or helium, a different flow rate may be used, or that such gas(es) may be omitted.

The epitaxial growth process of operation 230 further includes introducing a deposition gas including a higher order silane precursor gas and/or a chlorosilane precursor gas and a dopant precursor gas including an n-type dopant precursor gas into the processing region of a process chamber. Higher order silanes include silanes with the chemical formula $Si_xH_{(2x+2)}$ where x is 2 or more, for example, where x is 2, 3, 4, 5, 6, 7, 8, or more. Examples of higher order silanes include disilane ($Si_2H_6$), trisilane ($Si_3H_8$), and tetrasilane ($Si_4H_{10}$), or other higher order silanes. Chlorosilanes include chlorosilanes with the chemical formula $Cl_y$-$Si_xH_{(2x+2-y)}$ wherein y is 1 or more, 2 or more, 3 or more, or 5 or more, and x is one or more, or two or more, or 3 or more. In one example, y is from 5 to 8 and x is from 2 to 3. In at least one implementation, the chlorosilane precursor gas comprises, consists of, or consists essentially of chlorosilane (ClSiH3), dichlorosilane (Cl2SiH2), trichlorosilane (Cl3SiH), hexachlorodisilane ($Si_2Cl_6$), tetrachlorosilane ($SiCl_4$), pentachlorodisilane ($Cl_5Si_2H$), octachlorotrisilane (Cl8Si3), or a combination thereof. In one example, the deposition gas is introduced into the processing region at a flow rate in a range from about 1 sccm to about 500 sccm, or in a range from about 10 sccm to about 400 sccm, or in a range from about 50 sccm to about 300 sccm, or in a range from about 100 sccm to about 200 sccm.

The epitaxial growth process of operation 230 further includes introducing an n-type dopant precursor gas into the processing region. In at least one aspect, the n-type dopant precursor comprises, consists of, or essentially consists of a phosphorous containing precursor, an antimony precursor, an arsenic-containing precursor, or a combination thereof. In at least one implementation, the antimony-containing precursor includes one or a combination of stibine, antimony trichloride, antimony tetrachloride, antimony pentachloride, triphenylantimony, antimony trihydide, antimonytrioxide, antimony pentoxide, antimony trifluoride, antimony tribromide, antimonytriiodide, antimony pentafluoride, triethyl antimony, and trimethyl antimony. In at least one implementation, the phosphorous-containing precursor includes one or a combination of phosphine and alkylphosphines. Suitable alkylphosphines include trimethylphosphine ($(CH_3)_3P$), dimethylphosphine ($(CH_3)_2PH$), triethylphosphine ($(CH_3CH_2)_3P$), tert-butylphosphine, and diethylphosphine ($(CH_3CH_2)_2PH$). In at least one particular implementation, phosphine is used. In at least one implementation, the arsenic-containing precursor includes one or a combination of arsine ($AsH_3$), halogenated arsenic compounds, trimethylarsenic, and silylarsines $[(H_3Si)_{3-x}AsR_x]$ where x=0, 1, 2, and $R_x$ is hydrogen or deuterium. The n-type dopant precursor gas may have a flow rate in a range from about 0.1 sccm to 10,000 sccm, or in a range from about 100 sccm to about 5,000 sccm, or in a range from about 500 to about 3,000 sccm.

In some implementations, where the epitaxial layer is a silicon germanium (SiGe) layer, the deposition gas further includes a germanium source. Suitable germanium sources include germane (GeH4) and higher order germanes. Higher order germanes include compounds with the empirical formula $GexH_{(2x+2)}$, where x is two or more, for example, where x is two, three, four, or more. Examples of higher order germanes include digermane ($Ge_2H_6$), trigermane ($Ge_3H_8$) and tetragermane ($Ge_4H_{10}$), as well as others.

It is contemplated that the deposition precursor gases and the n-type dopant precursor gases may be introduced simultaneously, substantially simultaneously, or in any targeted order. In at least one aspect, the deposition precursor gases and the n-type dopant precursor gases are co-flowed into the process region simultaneously. In one implementation, at least two of the precursor gases are mixed prior to being delivered to the processing region. In another implementation, at least two of the precursor gases are delivered to the processing region separately and mixed within the processing region.

Optionally, in some implementations where operation 230 and 240 are performed in the same processing region, after operation 230 and prior to operation 240, a purge process is performed to remove any remaining higher order silane precursor gas, n-type dopant precursor gas, and any byproducts from the processing region. For example, excess higher order silane precursor gas, n-type dopant precursor gas, and reaction byproducts (if any) may be removed from the surface of the semiconductor device 300, for example, by pumping with inert gas. In some implementations, where an inert carrier gas is introduced into the processing region with the higher order silane precursor gas and/or the n-type dopant precursor gas, the flow of the higher order silane precursor gas and/or the n-type dopant precursor gas may be stopped while the inert carrier gas continues to flow to purge the processing region. In other implementations, the flow of the n-type dopant precursor gas is stopped while the higher order silane precursor gas continues to flow to purge the processing region. In some implementations, the purge process may include a purge cycle wherein the processing region is purged for a time period of less than approximately 5 seconds, or less than approximately 3 seconds, or even less than approximately 2 seconds. Excess vapor phase reactants, such as for example, excess higher order silane precursor gas, n-type dopant precursor gas, and possible reaction byproducts may be removed with the aid of a vacuum, generated by a pumping system in fluid communication with the processing region.

Figure 3D:
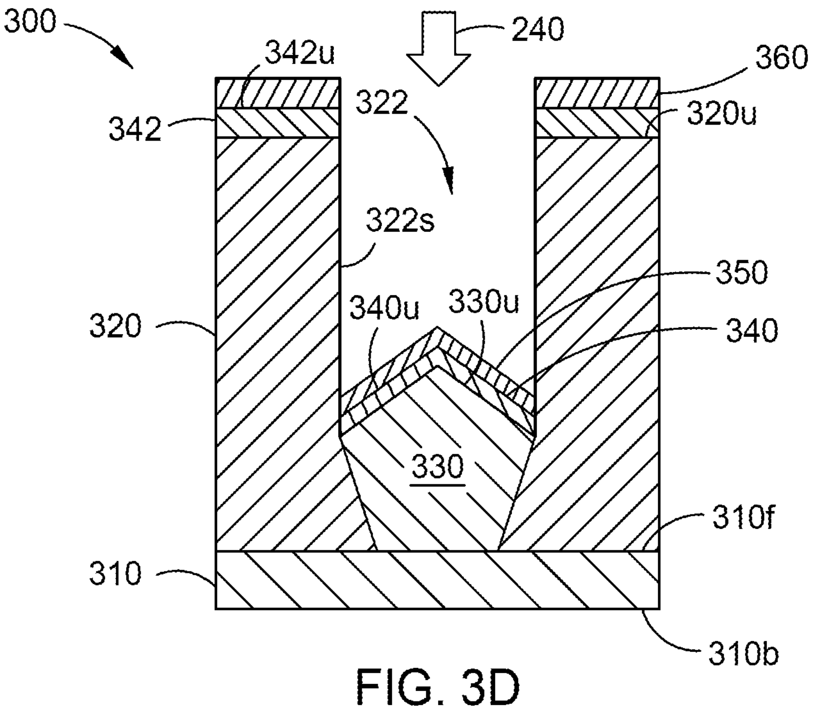

Referring to FIG. 2A, at operation 240, an undoped crystalline silicon-containing capping layer 350 is epitaxially grown over or directly on the upper surface 340*u* of the doped crystalline silicon-containing layer 340 and an undoped amorphous silicon-containing layer 360 is formed over or directly on the upper surface 342*u* of the doped amorphous silicon-containing layer 342. FIG. 3D illustrates a cross-sectional view of the semiconductor device 300 during intermediate stages of manufacturing corresponding to the operation 240. In the present disclosure, the undoped crystalline silicon-containing capping layer 350 and the undoped amorphous silicon-containing layer 360 being "undoped" includes implementations where the undoped crystalline silicon-containing capping layer 350 and the undoped amorphous silicon-containing layer 360 are unintentionally doped or otherwise doped with very low dopant concentration such that the undoped crystalline silicon-containing capping layer 350 and the undoped amorphous silicon-containing layer 360 do not contain sufficient carriers (electrons or holes) to be conductive under a typical electric field. The undoped crystalline silicon-containing capping layer 350 protects the underlying doped crystalline silicon-containing layer 340 during the subsequent selective etching process performed during operation 250 to remove the doped and undoped amorphous layers.

The undoped crystalline silicon-containing capping layer 350 is grown over or directly on the upper surface 340*u* of the doped crystalline silicon-containing layer 340 and the undoped amorphous silicon-containing layer 360 is grown over or directly on the upper surface 342*u* of the doped amorphous silicon-containing layer 342 during the same epitaxial deposition process. The epitaxial growth process of operation 240 may be performed using a higher order silane precursor gas and an optional carrier gas as described. The higher order silane precursor gas and the optional carrier gas may be the same gases used during the epitaxial growth process of operation 230. The epitaxial growth process of operation 240 may be performed using the same or similar processing conditions, for example, the same or similar temperature and pressure used during the epitaxial deposition process of operation 230. The undoped crystalline silicon-containing capping layer 350 is grown to a thickness such that at least a portion of the undoped crystalline silicon-containing capping layer 350 remains over the doped crystalline silicon-containing layer 340 during the subsequent selective removal process of operation 250.

The epitaxial deposition process of operation 240 may be performed in a processing chamber positioned on a cluster tool, for example, any of the processing chambers 124, 126, 128, 130 of the processing system 100 (see FIG. 1). In some implementations, operation 230 and operation 240 are performed in-situ in the same processing chamber. In other implementations, operation 230 and operation 240 are performed ex-situ in different processing chambers.

Figure 3E:
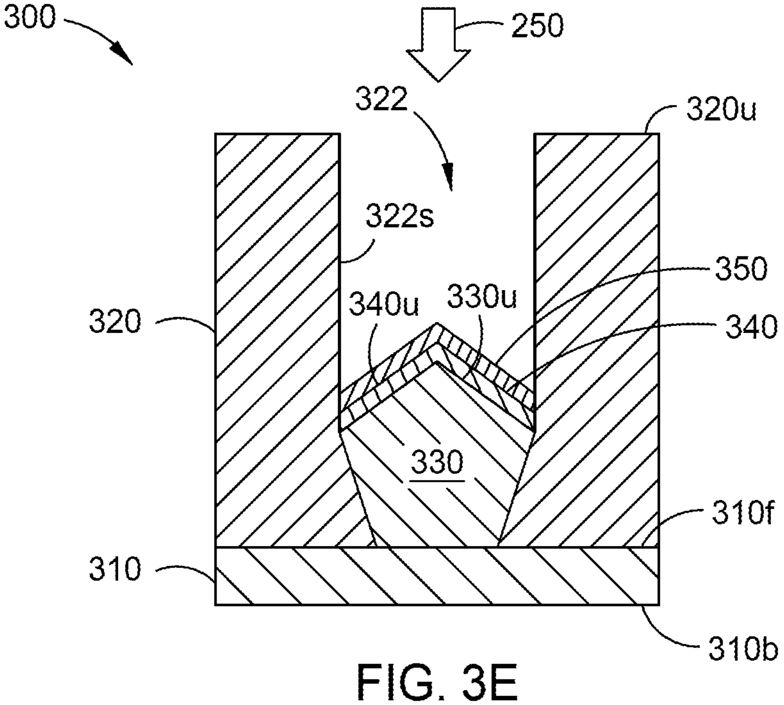

Referring to FIG. 2B, at operation 250, the doped amorphous silicon-containing layer 342 and the undoped amorphous silicon-containing layer 360 are selectively removed relative to the undoped crystalline silicon-containing capping layer 350, which is partially removed. FIG. 3E illustrates a cross-sectional view of the semiconductor device 300 during intermediate stages of manufacturing corresponding to the operation 250. During operation 250, an etching process is performed that is tuned to be selective to the amorphous materials of the undoped amorphous silicon-containing layer 360 and the doped amorphous silicon-containing layer 342 (such as doped and undoped amorphous silicon) and with no or minimal etching of the undoped crystalline silicon-containing capping layer 350 and the semiconductor layer 320. As a result, the undoped amorphous silicon-containing layer 360 and the doped amorphous silicon-containing layer 342 are removed to expose the upper surface 320*u* of the semiconductor layer 320 while the doped crystalline silicon-containing layer 340 remains protected by at least a portion of the undoped crystalline silicon-containing capping layer 350. The etching process of operation 260 can be dry etching, wet etching, reactive ion etching, or other suitable etching methods. In some implementations, the etching process of operation 250 is self-aligned meaning that no etch mask is needed. Rather, the etching process of operation 250 relies on the etch selectivity of the materials in the doped amorphous silicon-containing layer 342 and the undoped amorphous silicon-containing layer 360 relative to the undoped crystalline silicon-containing capping layer 350.

During the etching process of operation 250, an etching gas is introduced in the processing region to selectively remove the amorphous silicon-containing layers relative to the crystalline silicon-containing layers. In some implementations, the etching gas is selected from chlorine, germane, germanium chlorides, or a combination thereof. In some implementations, the etching gas is selected from Cl2, GeCl2, GeCl4, GeH4, or a combination thereof. In some implementations, the etching gas is free from hydrogen chloride (HCl). In the present disclosure, the etching gas being free from hydrogen chloride (HCl) includes implementations where the etching gas unintentionally contains HCl or otherwise contains a very low concentration of HCl such that the HCl gas does not etch under typical etching conditions. The etching gas may be introduced in the processing region at a flow rate in a range from about 1 sccm to about 1,000 sccm, or in a range from about 1 sccm to about 200 sccm, or in a range from about 1 sccm to about 100 sccm.

In some implementations, the doped amorphous silicon-containing layer 342 and the undoped amorphous silicon-containing layer 360 have etch selectivity relative to the undoped crystalline silicon-containing capping layer 350 (i.e., an etch rate of the amorphous silicon-containing materials is higher than an etch rate of the crystalline silicon-containing material). In some implementations, the etch selectivity (i.e., a ratio of the etch rate of the amorphous silicon-containing materials to the etch rate of the crystalline silicon-containing material) is in a range from about 100:1 to about 3000:1, 300:1 to about 3000:1, or in a range from about 300:1 to about 2000:1, or in a range from about 300:1 to about 1500:1.

The selective removal process of operation 250 may be performed in a processing chamber positioned on a cluster tool, for example, any of the processing chambers 124, 126, 128, 130 of the processing system 100 (see FIG. 1). In some implementations, operation 230, operation 240, and operation 250 are performed in-situ in the same processing chamber. In other implementations, operation 250 is performed ex-situ in a processing chamber different from operation 230 and operation 240.

Figure 3F:
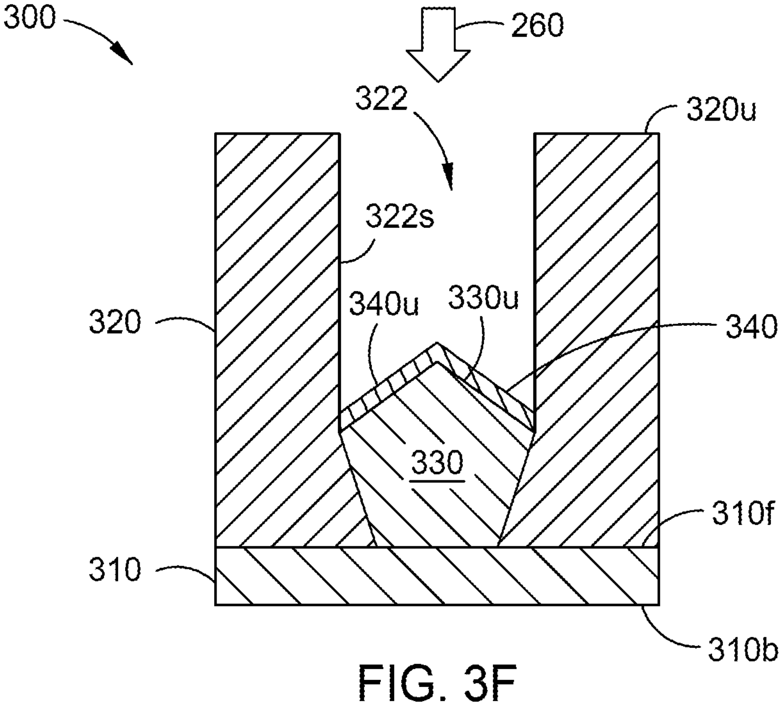

Referring to FIG. 2B, at operation 260, the undoped crystalline silicon-containing capping layer 350 is removed to expose the upper surface 340*u* of the doped crystalline silicon-containing layer 340. FIG. 3F illustrates a cross-sectional view of the semiconductor device 300 during intermediate stages of manufacturing corresponding to the operation 260. During operation 260 an etching process is performed that is tuned to be selective to the undoped crystalline silicon-containing capping layer 350 and with no or minimal etching of the material that forms the semiconductor layer 320 and the doped crystalline silicon-containing layer 340. As a result the undoped crystalline silicon-containing capping layer 350 is removed to expose the upper surface 340*u* of the doped crystalline silicon-containing layer 340. The etching process of operation 260 can be dry etching, wet etching, reactive ion etching, or other suitable etching methods. In some implementations, the etching process of operation 260 is self-aligned meaning that no etch mask is needed. Rather, the etching process of operation 260 relies on the etch selectivity of the materials in the undoped crystalline silicon-containing capping layer 350 relative to the materials of the semiconductor layer 320.

In some implementations, the material of the semiconductor layer 320 is a dielectric material, for example, a silicon oxide or silicon nitride, and the material of the undoped crystalline silicon-containing capping layer 350 has etch selectivity relative to the dielectric material of the semiconductor layer 320 (i.e., an etch rate of the material of the undoped crystalline silicon-containing capping layer 350 is higher than an etch rate of the dielectric material). In some implementations, the etch selectivity (i.e., a ratio of the etch rate of the undoped crystalline silicon-containing material to the etch rate of the dielectric material) is in a range from about 100:1 to about 3000:1, or in a range from about 1000:1 to about 2000:1.

Figure 3G:
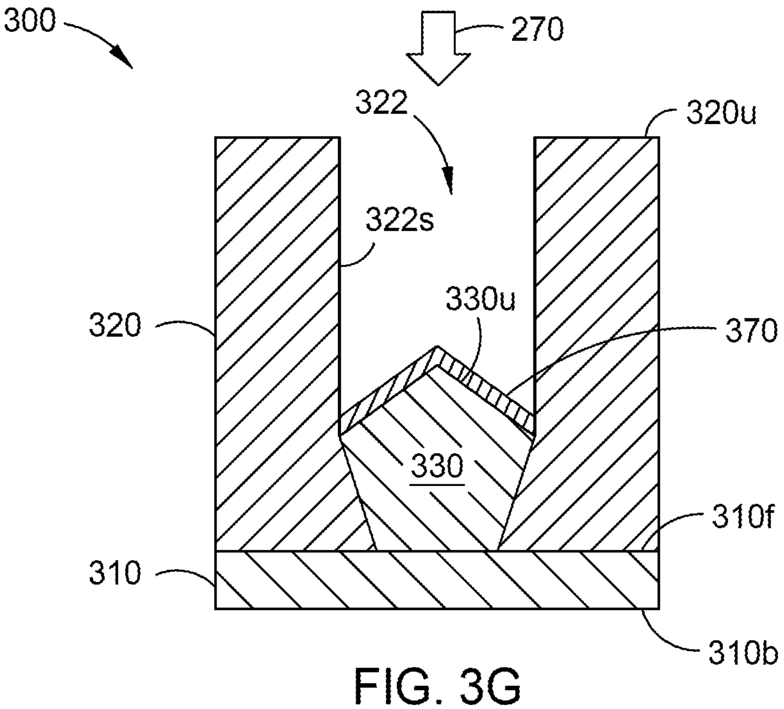

Referring to FIG. 2B, at operation 270, a metal silicide feature 370 is formed over the source/drain feature 330. FIG. 3G illustrates a cross-sectional view of the semiconductor device 300 during intermediate stages of manufacturing corresponding to the operation 270. In some implementations, the operation 270 includes depositing one or more metals into the trench 322, performing an annealing process to the semiconductor device 300 to cause reaction between the one or more metals and the doped crystalline silicon-containing layer 340 to produce the metal silicide feature 370. The operation 270 may further include removing unreacted portions of the one or more metals leaving the metal silicide feature 370. The one or more metals may include titanium (Ti), tantalum (Ta), tungsten (W), nickel (Ni), platinum (Pt), ytterbium (Yb), iridium (Ir), erbium (Er), cobalt (Co), or a combination thereof (e.g., an alloy of two or more metals) and may be deposited using CVD, PVD, ALD, or other suitable methods. The metal silicide feature 370 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

Figure 3H:
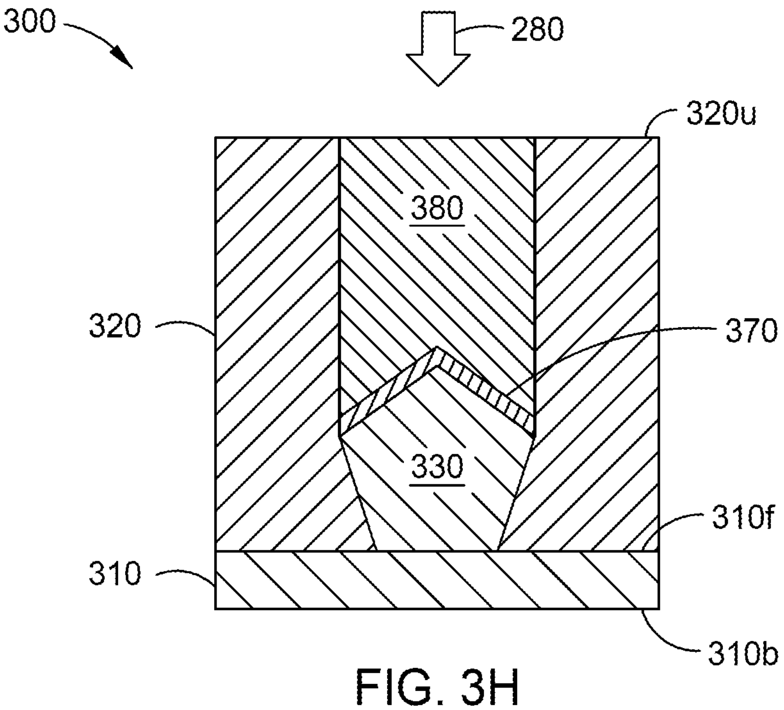

Referring to FIG. 2B, at operation 280, a metal-fill layer 380 is formed in the trench 322. FIG. 3H illustrates a cross-sectional view of the semiconductor device 300 during intermediate stages of manufacturing corresponding to the operation 280. The metal-fill layer 380 is formed over or directly on the metal silicide feature 370 as shown in FIG. 3H. The metal-fill layer 380 may include tungsten (W), cobalt (Co), molybdenum (Mo), ruthenium (Ru), copper (Cu), aluminum (Al), titanium (Ti), tantalum (Ta), or other metals, and may be formed by CVD, PVD, ALD, plating, or other suitable processes.

Referring to FIG. 2B, optionally at operation 290, the semiconductor device 300 may be exposed to additional processing. The operation 290 may include performing a CMP process to remove any overburden from the metal-fill layer 380. The operation 290 may include forming backside power rails (not shown) and a backside interconnect (not shown). The backside power rails are electrically connected to the metal-fill layer 380.

In summary, the previously described implementations of the present disclosure have many advantages, including low temperature selective epitaxial deposition for logic backside contact and other applications that involve low-temperature, selective, and high active-dopant epitaxial deposition. The method can be performed at temperatures below the thermal budget of the semiconductor device, for example, at temperatures of 480 degrees Celsius or less. The method includes the use of a higher order silane precursor and/or a higher order chlorosilane precursor, and an n-type dopant precursor selected from an antimony-containing precursor, a phosphorous-containing precursor, an arsenic-containing precursor, or a combination thereof. The methods, systems, and structures described enable the formation of backside PDNs. However, the present disclosure does not call for all the advantageous features and all the advantages need to be incorporated into every implementation of the present disclosure.

In the Summary and in the Detailed Description, and the Claims, and in the accompanying drawings, reference is made to particular features (including method operations) of the present disclosure. It is to be understood that the disclosure in this specification includes all possible combinations of such particular features. For example, where a particular feature is disclosed in the context of a particular aspect, implementation, or example of the present disclosure, or a particular claim, that feature can also be used, to the extent possible in combination with and/or in the context of other particular aspects and implementations of the present disclosure, and in the present disclosure generally.

Implementations and all of the functional operations described in this specification can be implemented in digital electronic circuitry, or in computer software, firmware, or hardware, including the structural means disclosed in this specification and structural equivalents thereof, or in combinations of them. Implementations described herein can be implemented as one or more non-transitory computer program products, i.e., one or more computer programs tangibly embodied in a machine readable storage device, for execution by, or to control the operation of, data processing apparatus, e.g., a programmable processor, a computer, or multiple processors or computers.

Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

The term "comprises" and grammatical equivalents thereof, for example, "including" and "having," are used herein to mean that other components, ingredients, operations, etc. are optionally present. For example, an article "comprising" (or "which comprises") components A, B, and C can consist of (i.e., contain only) components A, B, and C, or can contain not only components A, B, and C but also one or more other components. In addition, whenever a composition, an element or a group of elements is preceded with the transitional phrase "comprising" or grammatical equivalents thereof, it is understood that it is contemplated that the same composition or group of elements may be preceded with transitional phrases "consisting essentially of," "consisting of," "selected from the group of consisting of," or "is" preceding the recitation of the composition, element, or elements and vice versa.

Further, spatially relative terms, such as "beneath," "below," "lower," "above," "over," "on," "top," "upper," "backside," "frontside," and the like, may be used herein for ease of description to describe one element or features relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be incorporated.

Where reference is made herein to a method comprising two or more defined operations, the defined operations can be carried out in any order or simultaneously (except where the context excludes that possibility), and the method can include one or more other operations which are carried out before any of the defined operations, between two of the defined operations, or after all of the defined operations (except where the context excludes that possibility). In addition some of the operations described in the method 200 may be omitted unless stated otherwise.

When introducing elements of the present disclosure or exemplary aspects or implementation(s) thereof, the articles "a," "an," "the" and "said" are intended to mean that there are one or more of the elements.

While the foregoing is directed to implementations of the present disclosure, other and further implementations of the disclosure may be devised without departing from the basic scope thereof, and the scope thereof is determined by the claims that follow.

What is claimed is:

1. A method of forming a semiconductor device, comprising:

epitaxially growing a doped crystalline silicon-containing layer over a source/drain feature and growing a doped amorphous silicon-containing layer over a field region of a semiconductor layer, wherein a trench is formed in the semiconductor layer and the trench exposes the source/drain feature;

epitaxially growing an undoped crystalline silicon-containing capping layer over the doped crystalline silicon-containing layer and growing an undoped amorphous silicon-containing layer over the doped amorphous silicon-containing layer;

selectively removing the doped amorphous silicon-containing layer and the undoped amorphous silicon-containing layer relative to the undoped crystalline silicon-containing capping layer; and removing the undoped crystalline silicon-containing capping layer to expose the doped crystalline silicon-containing layer.

2. The method of claim 1, further comprising forming a metal silicide layer from the doped crystalline silicon-containing layer.

3. The method of claim 2, further comprising forming a metal-fill layer in the trench, the metal-fill layer formed over the metal silicide layer.

4. The method of claim 1, wherein epitaxially growing the doped crystalline silicon-containing layer and epitaxially growing the undoped crystalline silicon-containing capping layer are performed at a temperature below a thermal budget of the semiconductor device.

5. The method of claim 4, wherein the temperature is 500 degrees Celsius or less.

6. The method of claim 1, wherein epitaxially growing the doped crystalline silicon-containing layer, epitaxially growing the undoped crystalline silicon-containing capping layer, and selectively removing the doped amorphous silicon-containing layer are performed in a processing region of a processing chamber.

7. The method of claim 1, wherein epitaxially growing the doped crystalline silicon-containing layer and epitaxially growing the undoped crystalline silicon-containing capping layer are performed in a processing region of a processing chamber, wherein selectively removing the doped amorphous silicon-containing layer is performed in a second processing region of a second processing chamber and the semiconductor device is transferred from the processing region to the second processing region without breaking vacuum.

8. The method of claim 3, further comprising forming backside power rails on a backside of the semiconductor device, wherein the backside power rails are electrically coupled with the metal-fill layer.

9. A method of forming a semiconductor device, comprising:

epitaxially growing a doped crystalline silicon-containing layer over a source/drain feature and growing a doped amorphous silicon-containing layer over a field region of a semiconductor layer, wherein a trench is formed in the semiconductor layer and the trench exposes the source/drain feature, the epitaxially growing comprising:

flowing a higher order silane precursor gas and an n-type dopant precursor gas into a processing region of a process chamber, the higher order silane precursor gas having a chemical formula $Si_xH_{(2x+2)}$ where x is 2 or more;

epitaxially growing an undoped crystalline silicon-containing capping layer over the doped crystalline silicon-containing layer and growing an undoped amorphous silicon-containing layer over the doped amorphous silicon-containing layer, comprising:

flowing the higher order silane precursor gas into the processing region; and selectively removing the doped amorphous silicon-containing layer and the undoped amorphous silicon-containing layer relative to the undoped crystalline silicon-containing capping layer, comprising:

flowing an etching gas comprising Cl2, GeCl2, GeCl4, GeH4, or a combination thereof.

10. The method of claim 9, further comprising removing the undoped crystalline silicon-containing capping layer to expose the doped crystalline silicon-containing layer.

11. The method of claim 9, wherein the higher order silane precursor gas is selected from trisilane, tetrasilane, or a combination thereof.

12. The method of claim 11, wherein the n-type dopant precursor gas is a phosphorous containing precursor gas, an antimony containing precursor gas, an arsenic containing precursor gas, or a combination thereof.

13. The method of claim 12, wherein the etching gas is free from hydrogen chloride (HCl) gas.

14. The method of claim 9, wherein epitaxially growing the doped crystalline silicon-containing layer and epitaxially growing the undoped crystalline silicon-containing capping layer are performed at a temperature below a thermal budget of the semiconductor device.

15. The method of claim 14, wherein the temperature is 500 degrees Celsius or less.

16. The method of claim 9, wherein the trench formed in the semiconductor layer is formed in a backside of the semiconductor device.

17. A method of forming a semiconductor device, comprising:

providing a device structure having a trench formed in a semiconductor layer, wherein the trench exposes a source/drain feature from a backside of the device structure and the semiconductor layer is formed over a device substrate;

performing a first epitaxial deposition process to grow a doped crystalline silicon layer over the source/drain feature and grow a doped amorphous silicon layer over a field region of the semiconductor layer;

performing a second epitaxial deposition process to grow an undoped crystalline silicon capping layer over the doped crystalline silicon layer and grow an undoped amorphous silicon layer over the doped amorphous silicon layer; and performing a selective etching process to remove the undoped amorphous silicon layer and the doped amorphous silicon layer relative to the undoped crystalline silicon capping layer.

18. The method of claim 17, wherein the first epitaxial deposition process comprises introducing a deposition gas comprising a higher order silane precursor gas and/or a chlorosilane precursor gas and a dopant precursor gas including an n-type dopant precursor gas into a processing region of a process chamber, the higher order silane precursor gas having a chemical formula of $Si_xH_{(2x+2)}$ where x is 2 or more.

19. The method of claim 18, further comprising purging the processing region after the first epitaxial deposition process and prior to the second epitaxial deposition process.

20. The method of claim 19, wherein the second epitaxial deposition process comprises introducing a deposition gas comprising the higher order silane precursor gas into the processing region.

* * * * *